United States Patent
Murayama

(10) Patent No.: US 6,552,359 B2
(45) Date of Patent: Apr. 22, 2003

(54) DRIVE CIRCUIT AND METHOD OF TESTING THE SAME

(75) Inventor: Jin Murayama, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/940,912

(22) Filed: Aug. 29, 2001

(65) Prior Publication Data

US 2002/0048830 A1 Apr. 25, 2002

(30) Foreign Application Priority Data

Aug. 30, 2000 (JP) ........................... 2000-260335

(51) Int. Cl.[7] .............................................. H01L 23/58
(52) U.S. Cl. ............................................ 257/48; 438/17
(58) Field of Search ......................... 326/59; 257/40, 257/48; 385/31; 438/17, 18

(56) References Cited

U.S. PATENT DOCUMENTS 6,133,754 A * 10/2000 Olson ........................... 326/59
6,306,943 B1 * 10/2001 Yu ................................. 257/40

* cited by examiner

Primary Examiner—John F. Niebling
Assistant Examiner—Andre C Stevenson
(74) Attorney, Agent, or Firm—Whitham, Curtis & Christofferson, P.C.

(57) ABSTRACT

The drive circuit is formed on a substrate by a first fabrication process and drives a plurality of elements to be driven being formed on the substrate by a second fabrication process which is different from the first fabrication process. The drive circuit includes driver transistors provided between a first signal line and the plurality of elements to be driven, a control circuit for performing on-off control on the driver transistors and a test circuit for testing the drive circuit. The test circuit includes switching elements and resistor elements that are series connected between a second signal line and junctions of the driver transistors and the elements to be driven, respectively, and performs on-off control on the switching elements in response to a control signal. The testing method tests the drive circuit that has been formed on the substrate, before the plurality of elements to be driven are formed on the substrate. The method turns on the switching elements of the test circuit in response to the control signal and performs on-off control on the driver transistors by the control circuit.

13 Claims, 4 Drawing Sheets

DRIVE CIRCUIT AND METHOD OF TESTING THE SAME

BACKGROUND OF THE INVENTION

This invention relates to a drive circuit for driving a plurality of elements to be driven which is furnished with a test circuit for testing itself. The invention also relates to a method of testing the drive circuit.

To fabricate the recording head of a thermal ink-jet printer, for instance, a drive circuit is formed on a semiconductor substrate (silicon substrate) and overlaid on it with a heater (heat-generating resistor) material, followed by the formation of cavities and orifice nozzles on the heater. The cavities serve as pixel-based ink chambers and ink is projected through the orifice nozzles. Since the ink will be supplied from a back side of the silicon substrate, ink supply holes are made through the silicon substrate.

The heater material is usually polysilicon and other materials that are manufactured in the ordinary semiconductor fabrication process. Occasionally, for instance, Ta alloys and other special materials that are not very common in the ordinary semiconductor fabrication process are employed. In a case of using a special material on the heater, a semiconductor fabrication process for forming the drive circuit is followed by another fabrication process that is intended to form a heater using the Ta alloy.

After the semiconductor fabrication process, it is preferable that the semiconductor device can be tested to confirm its completion without connecting the heater as elements to be driven. If the semiconductor device is found inoperable at this stage, for instance, one can avoid waste by not forming a heater on a defective device. However, the conventional drive circuit has had a problem of inability to test the semiconductor device unless the heater is formed on it.

This problem is further described below with reference to two examples of the prior art drive circuit.

FIG. 3A shows in conceptual form a thermal ink-jet head using an exemplary prior art drive circuit in its completed form, and FIG. 3B shows the same thermal ink-jet head except that the drive circuit is in an incompleted form. In a recording head 38 shown in FIGS. 3A and 3B a drive circuit 40 comprises driver transistors T11–T15 and a control circuit 36 for performing on-off control on these driver transistors T11–T15. Driver transistors T11–T15 correspond to heat-generating resistors R11–R15, respectively, which in turn correspond to a plurality of recording elements that perform printing.

The heat-generating resistors R11–R15 are connected at one end to a common ground GND and connected at the other end to sources of the driver transistors T11–T15. Drains of the driver transistors T11–T15 are connected to a common power supply VD1 and their gates are supplied with control signals from the control circuit 36 respectively. In the illustrated case, only five recording elements are shown to simplify the explanation.

The control circuit 36 in the illustrated case is a decoder which comprises decoder circuits D1–D5 for decoding signals C1–C4. The control circuit 36 may be composed of a shift register and other circuits, for instance, as shown in FIGS. 4A and 4B. The control circuit 36 in FIGS. 3A and 3n is replaced by the shift register 42 in FIG. 4A which shows the drive circuit of a thermal ink-jet head in its completed form and in FIG. 4B showing the same drive circuit in an incompleted form.

In addition to the shift register 42 for accessing heat-generating resistors R11–R15, the drive circuit shown in FIGS. 4A and 43 also has a control signal line CTRL2 for performing on-off control of the heat-generating resistors R11–R15, as well as transistors T31–T35 which are switching elements connected to the control signal line CTRL2 to control connection and non-connection between outputs of the shift register 42 and driver transistors T11–T15.

In the recording head 38 in completed form which is shown in FIG. 3A, for instance, when driver transistors T11–T15 are turned on in response to control signals from the control circuit 36, current flows through the respectively corresponding heat-generating resistors R11–R15 and a specified amount of ink is projected from nozzles which are the corresponding recording elements. Conversely, if the driver transistors T11–T15 are turned off, no current flows to the heat-generating resistors R11–R15 and no ink is projected from the nozzles.

In the recording head 38 in an incompleted form which is shown in FIG. 3B, the heat-generating resistors R11–R15 to be driven are not connected to the drive circuit 40 and the sources of the driver transistors T11–T15 are opened, so it is impossible to check if the drive circuit 40 is operative or not. While the problem with the prior art has been described above with particular reference to the recording head of an ink-jet printer, it should be noted that the same problem exists in all other devices that are furnished with the drive circuit, as exemplified by an LED (light-emitting diode) array, an EL (electroluminescent) panel, a magnetostrictor and other devices.

SUMMARY OF THE INVENTION

An object of the present invention is to solve above described problem based on the prior art to provide a drive circuit that can be tested for reliability after it has been formed on a substrate by the first fabrication process but before a plurality of elements to be driven are formed on the same substrate by the second fabrication process.

Another object of the present invention is to provide a method of testing the drive circuit.

The object of the invention can be attained by a drive circuit that is formed on a substrate by a first fabrication process and that drives a plurality of elements to be driven being formed on the substrate by a second fabrication process which is different from the first fabrication process, comprising driver transistors provided between a first signal line and the plurality of elements to be driven; a control circuit for performing on-off control on the driver transistors; and a test circuit for testing the drive circuit, the test circuit comprising switching elements and resistor elements that are series connected between a second signal line and junctions of the driver transistors and the elements to be driven respectively, wherein the test circuit performs on-off control on the switching elements in response to a control signal.

Preferably, the plurality of elements to be driven are heat-generating resistors, magnetostrictors or light emitters and are connected between each of the driver transistors corresponding to each of the plurality of elements to be driven and the second signal line.

Another object of the invention can be attained by a method of testing a drive circuit that drives a plurality of elements to be driven, the drive circuit comprising a driver transistors provided between a first signal line and the plurality of elements to be driven, a control circuit for performing on-off control on the driver transistors, and a test circuit for testing the drive circuit, the test circuit comprising switching elements and resistor elements that are series connected between a second signal line and junctions of the driver transistors and the elements to be driven respectively, the test circuit performing on-off control on the switching elements in response to a control signal, comprising steps of: forming the drive circuit on a substrate by a first fabrication process; before the plurality of elements to be driven are formed by a second fabrication process which is different from the first fabrication process, on the substrate on which the drive circuit has been formed, turning on the switching elements of the test circuit in response to the control signal; and performing on-off control on the driver transistors by the control circuit.

Preferably, the drive circuit is tested by changing electric potential of the first signal line to either power supply potential or ground potential.

Preferably, the drive circuit is tested by adjusting electric potential of the first signal line to an intermediate level between power supply potential and ground potential.

DESCRIPTION OF THE PREFERRED EMBODIMENTS

A drive circuit and a method of testing it in accordance with the present invention are described below in detail with reference to the preferred embodiments shown in accompanying drawings.

Figure 1:
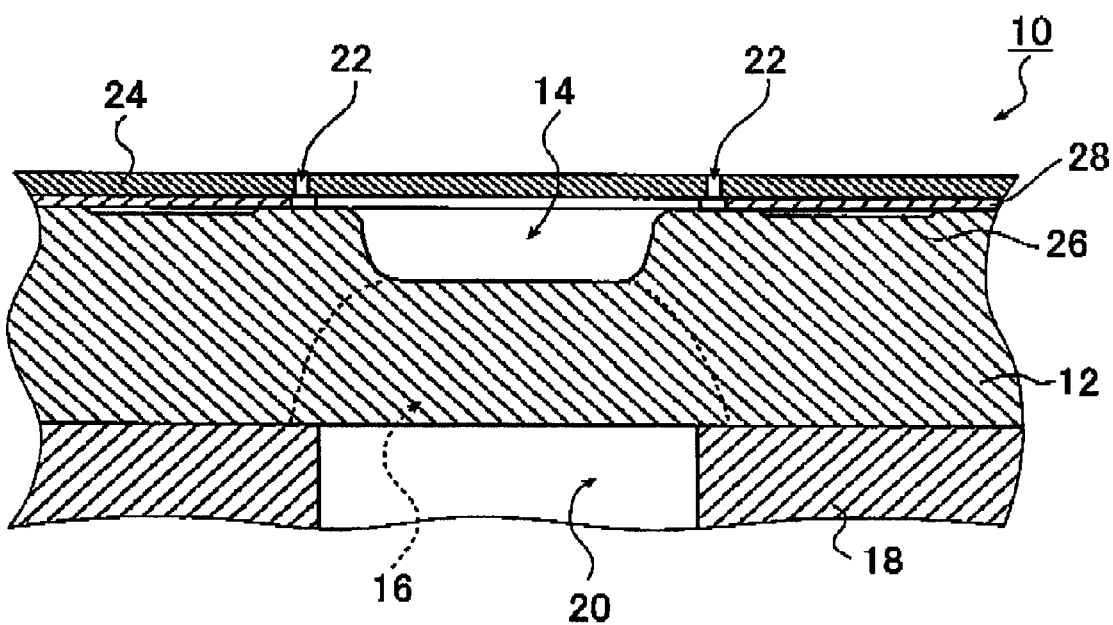
FIG. 1 shows in section an exemplary recording head of a thermal ink-jet printer using the drive circuit of the present invention.

FIG. 1 shows in section an exemplary recording head of a thermal ink-jet printer using the drive circuit of the present invention. A semiconductor device 10 shown in FIG. 1 uses the drive circuit of the present invention and which has been made by the semiconductor fabrication technology. At a center of a semiconductor substrate (silicon substrate) 12, an ink groove 14 through which ink is supplied to nozzles is formed by digging a surface of the substrate 12 such that it extends in a direction normal to the paper on which FIG. 1 is drawn.

To supply ink to the ink groove 14, a plurality of ink supply holes 16 that connect a back side of t he semiconductor substrate 12 with the ink groove 14 are made in the ink groove 14 at specified intervals in a direction in which the ink groove 14 extends. A support frame 18 is provided to aid in placement of the semiconductor substrate 12. An ink groove 20 is formed in the support frame 18. The ink groove 20 supplies ink supplied from an ink tank (not shown) to the ink groove 14 which is formed on a front side of the semiconductor substrate 12 via the ink supply holes 16.

In two positions on the surface of the semiconductor substrate 12 which are symmetrical with the ink groove 14, two nozzle rows are formed by alternately arranging a plurality of nozzles 22 at equal spacings along the ink groove 14. Each nozzle (orifice) 22 is a hollow cylinder and formed in an orifice plate 24 which overlies the semiconductor substrate 12 and is typically made of a polyimide. If nozzle density is 360 npi (nozzles per inch), each nozzle row consists of nozzles 22 that are arranged on a pitch of about 71 μm in a direction normal to the paper and given two nozzle rows, a resolution of 720 npi can be realized.

Above the semiconductor substrate 12 but under the nozzle rows, heat-generating resistors (not shown) are formed to control ink injection from the individual nozzles 22. In areas of the surface of the semiconductor substrate 12 which are on opposite sides of the ink groove 14 and outside the nozzle rows, a drive circuit 26 is formed to drive the individual heat-generating resistors. Between the surface of the semiconductor substrate 12 and the orifice plate 24, partitions 28 are formed to define ink passageways through which ink is supplied from the ink groove 14 to individual nozzles 22.

Ink supplied from the ink tank flows through the ink groove 20 in the support frame 18 to be supplied into the ink groove 14 in the front side of the semiconductor substrate 12 via the ink supply holes 16 also made in the substrate 12; the ink then flows through the ink passageways formed by the partitions 28 and is distributed between the nozzle rows formed on both sides of the ink groove 14. The drive circuit 26 performs on-off control on the respective heat-generating resistors in accordance with supplied image data and a specified amount of ink is projected from the corresponding nozzles 22.

We next describe the drive circuit of the invention.

Figure 2A:
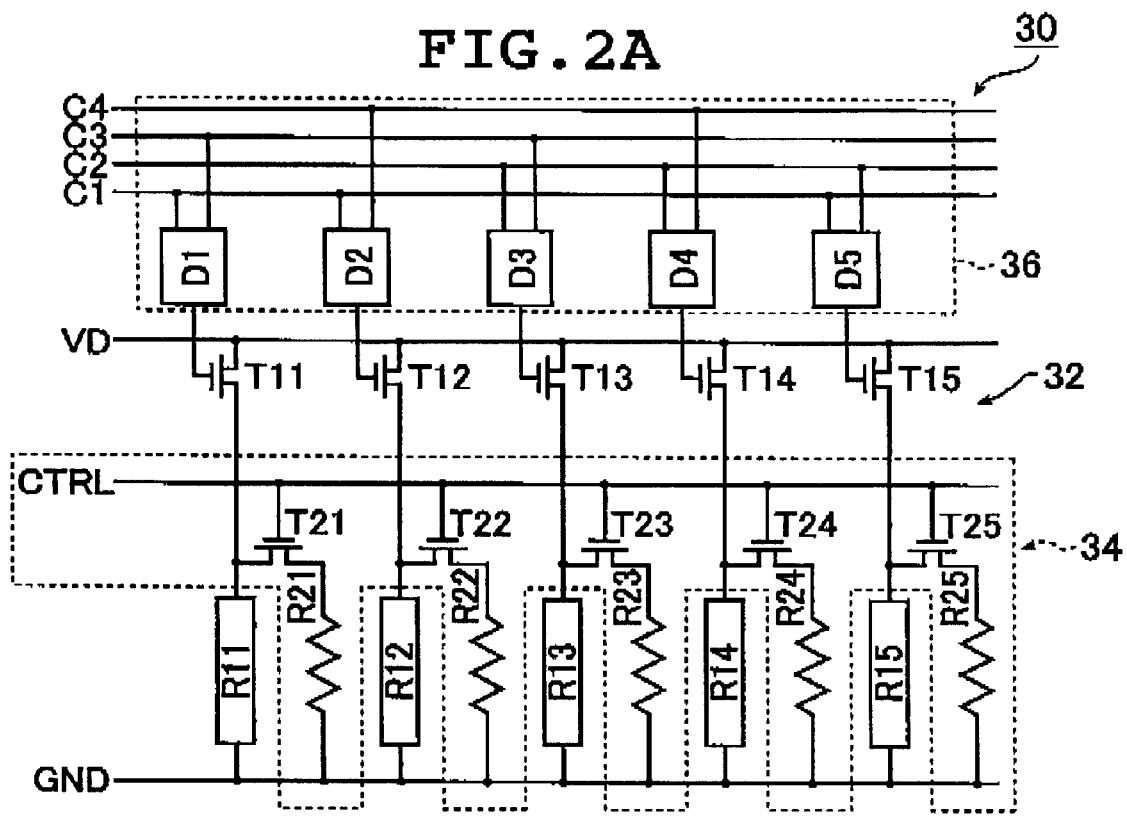
FIG. 2A shows in conceptual form a thermal ink-jet head using an example of the drive circuit of the present invention in its completed form.
Figure 2B:
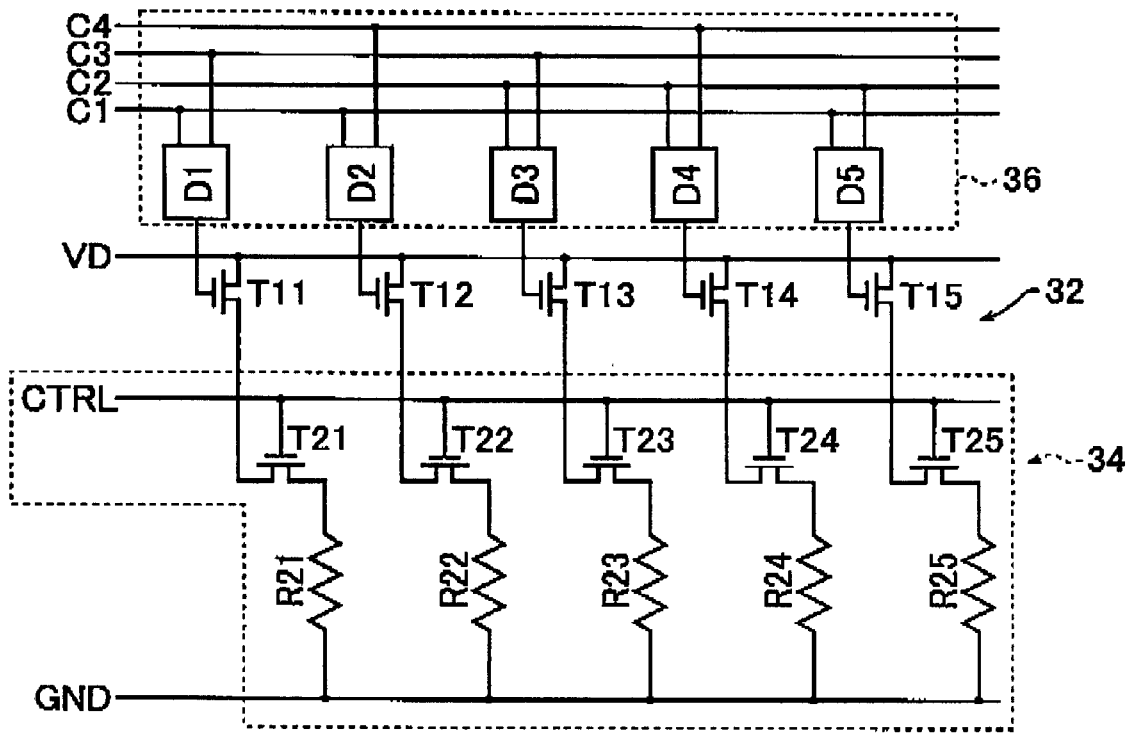
FIG. 2B shows the same thermal ink-jet head as FIG. 2A except that the drive circuit is in an incompleted form.

FIG. 2A shows in conceptual form a thermal ink-jet head using an example of the drive circuit of the present invention in its completed form and FIG. 2B shows the same thermal ink-jet head as FIG. 2A except that the drive circuit is in an incompleted form. A recording head 30 shown in FIGS. 2A and 2B is obtained by applying the present invention to the conventional recording head 38 in FIGS. 3A and 33. The drive circuit 32 shown in FIGS. 2A and 2B differs from the drive circuit 40 in FIGS. 3A and 3B in that it includes a test circuit 34. In all other components, the drive circuit 32 is identical to the drive circuit 40 shown in FIGS. 3A and 3B.

To state more specifically, the drive circuit 32 comprises driver transistors T11–T15, control circuit 36, and test circuit 34. Driver transistors T11–T15 correspond to heat-generating resistors R11–R15, respectively, which in turn correspond to a plurality of recording elements that perform printing. Control circuit 36 performs on-off control on these driver transistors T11–T15. Test circuit 34 tests the drive circuit 32 of recording head 30 in an incompleted form and comprises transistors T21–T25 (switching elements) and resistor elements R21–R25.

The heat-generating resistors R11–R15 are connected at one end to a common ground (second signal line) GND and connected at the other end to the sources of the driver transistors T11–T15. Drains of the driver transistors T11–T15 are connected to a common power supply (first signal line) VD and their gates are supplied with control signals from the control circuit 36 respectively. As in the case shown in FIGS. 3A and 3B, only five recording elements are shown to simplify the explanation.

Drains of the transistors T21–T25 which are the switching elements in the test circuit 34 are connected to junctions between the driver transistors T11–T15 and heat-generating resistors R11–R15 which are the elements to be driven; sources of the transistors T21–T25 are connected to resistor elements R21–R25 at one end; their gates are supplied with a common control signal CTRL for performing on-off control on those transistors. The resistor elements R21–R25 are connected at the other end to a common ground (second signal line) GND. In other words, each of the switching elements (transistors T21–T25) and the resistor elements R21–R25 is connected in series between the ground GND and the junctions of the driver transistors T11–T15 and the heat-generating resistors R11–R15 which are the elements to be driven, namely, between both sides of the heat-generating resistors R11–R15.

The resistor elements R21–R25 are made of material such as polysilicon, diffusion layer and others that can be formed by the semiconductor fabrication process. on the other hand, the heat-generating resistors R11–R15 are formed of Ta alloys, for instance, and other special materials that are not commonly used in the ordinary semiconductor fabrication process. Therefore, the drive circuit 32 is first formed on the semiconductor substrate by the semiconductor fabrication process (first fabrication process) and thereafter the plurality of heat-generating resistors R11–R15 are formed on the same semiconductor substrate by a different fabrication process (second fabrication process).

We now describe the operation of this drive circuit in accordance with the drive circuit testing method of the present invention.

Consider first the recording head in an incompleted form which is shown in FIG. 2B. This recording head has the drive circuit 32 formed on the semiconductor substrate by the semiconductor fabrication process but has none of the heat-generating resistors R11–R15 formed on the same semiconductor substrate by the different fabrication process. In response to the control signal CTRL, all transistors T21–T25 which are switching elements are turned on and the driver transistors T11–T15 are selectively turned on and off by the control circuit 36 to test the drive circuit 32.

In this case of the drive circuit 32, the driver transistors T11–T15, the transistors T21–T25 which are the switching elements in the test circuit 34 and the resistor elements R21–R25 are connected in series between the power supply VD and the ground GND. Assume here that the driver transistor T11, for instance, is turned on; the current flowing between the power supply VD and the ground GND is measured to detect if the control circuit 36 and the driver transistors T11–T15 are defective or not.

Thus, in the recording head shown in FIG. 2B which is in an incompleted form, the heat-generating resistors R11–R15 which are the elements to be driven are not connected to the drive circuit 32 but one can use the test circuit 34 to check good or bad of the drive circuit 32.

If desired, the drive circuit 32 may be tested by changing the potential of the power supply VD to either the power supply potential or the ground potential. This is an effective technique for a printer and others that employ a thermal ink-jet, an LED array and others as the recording head. Alternatively, the drive circuit 32 may be tested by adjusting the potential of the power supply VD to an analog voltage intermediate between the power supply potential and the ground potential. This is an effective technique for a display device and others such as an EL panel, for instance, that emits varying intensity of light depending on the power supply voltage.

Consider next the recording head in a completed form which is shown in FIG. 2A. This recording head has the drive circuit 32 formed on the semiconductor substrate by the semiconductor fabrication process and it also has the plurality of heat-generating resistors R11–R15 formed on the same semiconductor substrate by the different fabrication process. In response to the control signal CTRL, all transistors T21–T25 which are the switching elements are turned off and the driver transistors T11–T15 are selectively turned on and off by the control circuit 36 to use the recording circuit.

Further speaking about the recording head in completed form which is shown in FIG. 2A, when the driver transistors T11–T15 are turned on in response to control signals from the control circuit 36, current flows through the corresponding heat-generating resistors R11–R15 respectively and a specified amount of ink is projected from nozzles which are the corresponding recording elements. Conversely, if the driver transistors R11–T15 are turned off, no current flows through the heat-generating resistors R11–R15 and no ink is projected from the nozzles.

Figure 3A:
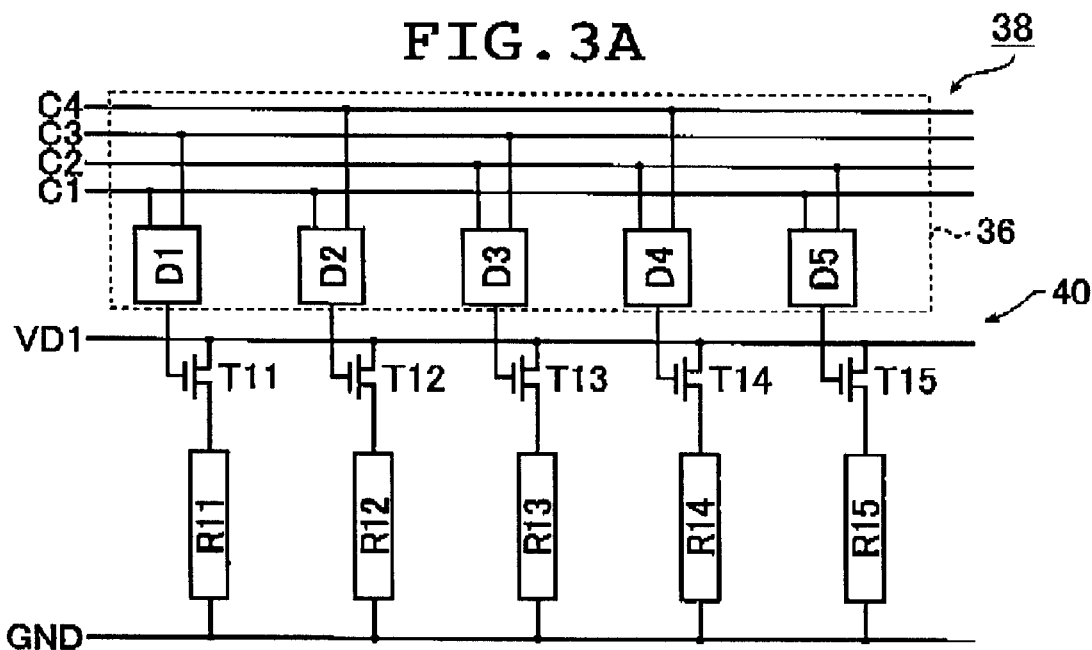
FIG. 3A shows in conceptual form a thermal ink-jet head using a prior art drive circuit in its completed form.
Figure 3B:
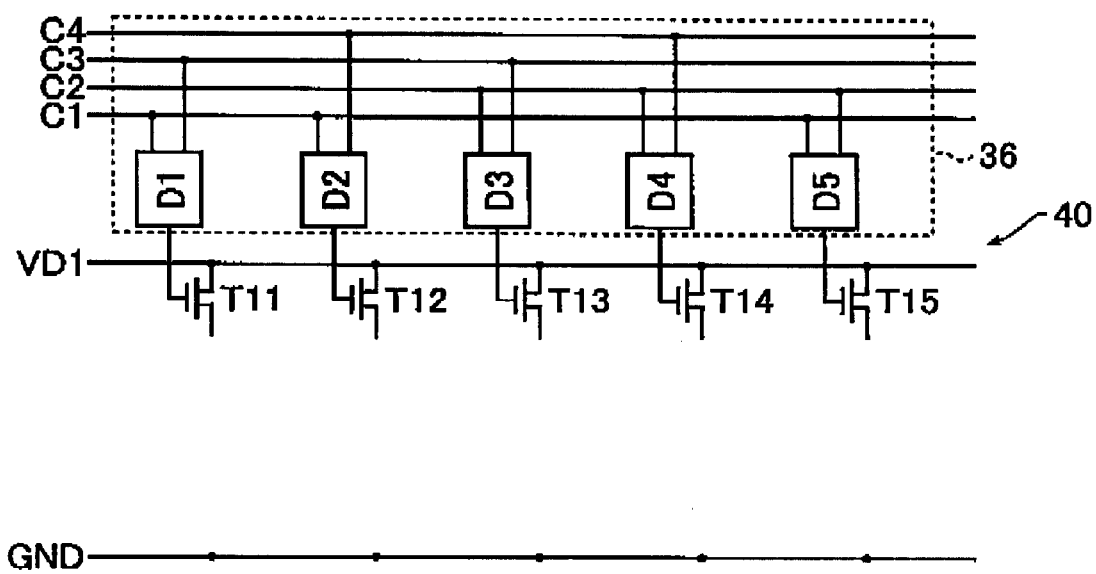
FIG. 3B shows the same thermal ink-jet head as FIG. 3A except that the drive circuit is in an incompleted form.

Thus, if the test circuit 34 is electrically isolated from the recording head in its completed form which is shown in FIG. 2A, one can use this recording head in entirely the same manner as the conventional recording head shown in FIGS. 3A and 3B.

If desired, the recording head in the completed form shown in FIG. 2A can be used with all switching elements, the transistors T21–T25, being turned on in response to the control signal CTRL. In this case, amount of the current flow through the heat-generating resistors R11–R15 can be reduced by the resistor elements R21–R25, so choice can be made between two recording density levels on a printer and others using a recording head that employs an LED array, for instance.

In the illustrated case, n-type MOS transistors are used as the driver transistors T11–T15 and the switching element transistors T21–T25. This is not the sole case of the invention and other types of transistors may be used, such as p-type MOS transistors and CMOS transistors which are the combination of n-type and p-type MOS transistors. Transistors are by no means limited to MOS transistors and bipolar transistors may also be used. The bipolar transistors that can be used are either of pnp or npn type.

The present invention is applicable to all types of thermal ink-jet heads including monochromatic and color heads. Recording heads of various known structures may be used, as exemplified by the top shooter type (face ink-jet) and side shooter type (edge ink-jet). The number of nozzle rows may be one or more than two. In the illustrated case, five recording elements are used but there is no limitation on the number of recording elements.

Figure 4A:
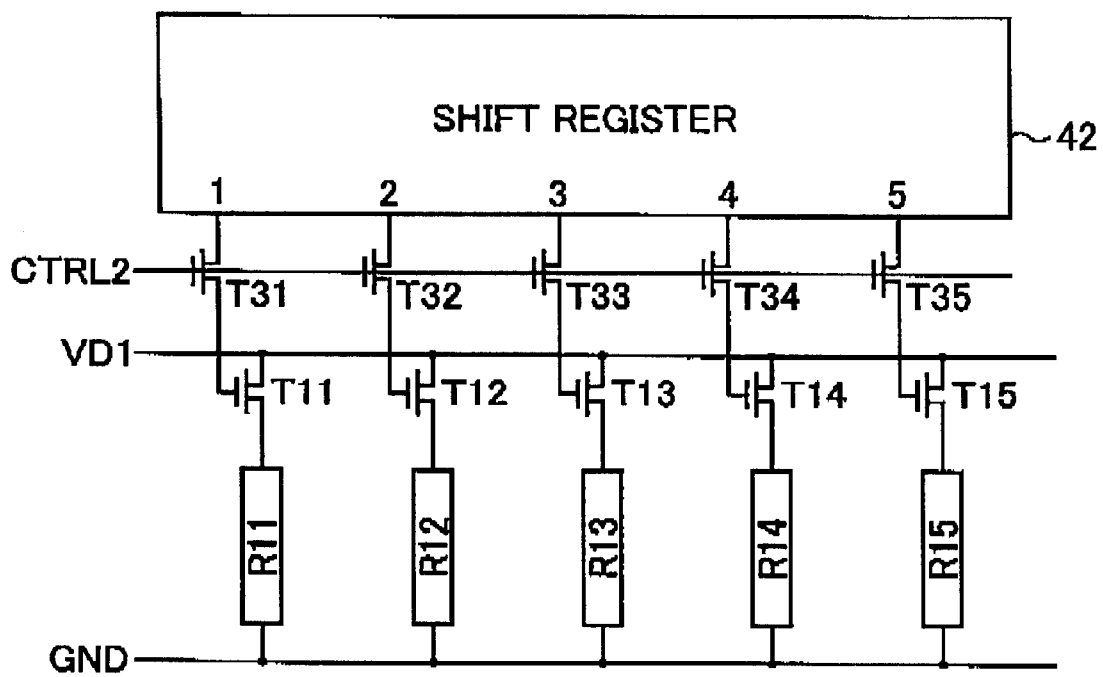
FIG. 4A shows in conceptual form a thermal ink-jet head using another prior art drive circuit in its completed form.
Figure 4B:
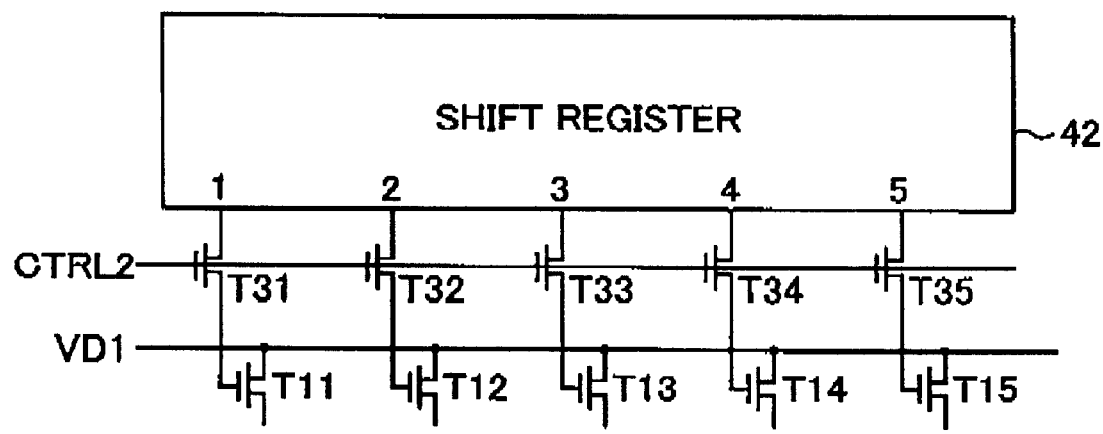
FIG. 4B shows the same thermal ink-jet head as FIG. 4A except that the drive circuit is in an incompleted form.

The illustrated case concerns the recording head of the thermal ink-jet printer but this is not the sole case of the present invention and it is equally applicable to other devices that are furnished with a drive circuit as exemplified by an LED (light-emitting diode) array, an EL (electroluminescent) panel, a magnetostrictor and other devices. The control circuit 36 may be a decoder as shown in FIGS. 2A and 2B or it may be composed of a shift register as indicated by 42 in FIGS. 4A and 4B.

While the basic features of the drive circuit of the present invention and the method of testing it have been described above in detail, it should be noted that the present invention is by no means limited to the foregoing embodiments and various improvements and modifications can of course be made without departing from the spirit and scope of the present invention.

As described above in detail, the drive circuit of the present invention is formed on a substrate by the first fabrication process and before a plurality of elements to be driven are formed on the same substrate by the second fabrication process which is different from the first fabrication process, the drive circuit is tested by turning on the switching elements in response to a control signal and performing on-off control on the driver transistors by the control circuit.

Hence, the drive circuit of the present invention can be tested after it is formed on the substrate by the first fabrication process but before the plurality of elements to be driven are formed on the same substrate by the second fabrication process. By testing the drive circuit in accordance with the method of the present invention, first, one can detect a defective device before it is wired in complete form, thus avoiding the need to apply a subsequent manufacturing step to that defective devices; this contributes to cost reduction. Second, by clearly identifying the cause of a particular defect as it occurs, one can take an immediate remedial action.

What is claimed is:

1. A drive circuit that is formed on a substrate by a first fabrication process and that drives a plurality of elements to be driven being formed on said substrate by a second fabrication process which is different from said first fabrication process, comprising:

driver transistors provided between a first signal line and said plurality of elements to be driven;

a control circuit for performing on-off control on said driver transistors; and a test circuit for testing said drive circuit, said test circuit comprising switching elements and resistor elements that are series connected between a second signal line and junctions of said driver transistors and said elements to be driven respectively, wherein said test circuit performs on-off control on said switching elements in response to a control signal.

2. The drive circuit according to claim 1, wherein said plurality of elements to be driven are heat-generating resistors, magnetostrictors or light emitters and are connected between each of said driver transistors corresponding to each of said plurality of elements to be driven and said second signal line.

3. A method of testing a drive circuit that drives a plurality of elements to be driven, said drive circuit comprising driver transistors provided between a first signal line and said plurality of elements to be driven, a control circuit for performing on-off control on said driver transistors, and a test circuit for testing said drive circuit, said test circuit comprising switching elements and resistor elements that are series connected between a second signal line and junctions of said driver transistors and said elements to be driven respectively, said test circuit performing on-off control on said switching elements in response to a control signal, comprising steps of:

forming said drive circuit on a substrate by a first fabrication process;

before said plurality of elements to be driven are formed by a second fabrication process which is different from said first fabrication process, on said substrate on which said drive circuit has been formed, turning on said switching elements of said test circuit in response to said control signal; and performing on-off control on said driver transistors by said control circuit.

4. The method according to claim 3, wherein said drive circuit is tested by changing electric potential of said first signal line to either power supply potential or ground potential.

5. The method according to claim 3, wherein said drive circuit is tested by adjusting electric potential of said first signal line to an intermediate level between power supply potential and ground potential.

6. The drive circuit according to claim 2, wherein the drive circuit is part of a recording head of a thermal ink-jet printer and said plurality of elements to be driven are heat-generating resistors.

7. The drive circuit according to claim 6, wherein the driver transistors, the control circuit for performing on-off control on said driver transistors, and the test circuit for testing said drive circuit are formed on a semiconductor substrate and the heat-generating resistors are overlaid on the semiconductor substrate.

8. The drive circuit according to claim 7, wherein resistor elements of the test circuit are connected in parallel with corresponding ones of the heat-generating resistors when corresponding ones of the switching elements are turned on.

9. The method according to claim 3, further comprising the step of forming the plurality of elements to be driven by a second fabrication process which is different from said first fabrication process on said substrate on which said drive circuit has been formed only if the drive circuit passes the test.

10. The method according to claim 9, said plurality of elements to be driven are heat-generating resistors, magnetostrictors or light emitters and are connected between each of said driver transistors corresponding to each of said plurality of elements to be driven and said second signal line.

11. The method according to claim 10, wherein the drive circuit is part of a recording head of a thermal ink-jet printer and said plurality of elements to be driven are heat-generating resistors.

12. The method according to claim 11, wherein the driver transistors, the control circuit for performing on-off control on said driver transistors, and the test circuit for testing said drive circuit are formed on a semiconductor substrate by said first fabrication process and the heat-generating resistors are overlaid on the semiconductor substrate by said second fabrication process which is different from said first fabrication process.

13. The method according to claim 12, further comprising the step of connecting corresponding ones of the resistor elements of the test circuit in parallel with corresponding ones of the heat-generating resistors when corresponding ones of the switching elements are turned on, thereby allowing control of current through the heat-generating resistors to modulate density of ink on a recording medium.

* * * * *